(12) United States Patent
Shimada (10) Patent No.: US 6,354,856 B1
(45) Date of Patent: Mar. 12, 2002

(54) IC SOCKET AND CONTACT PIN THEREOF (75) Inventor: Hideo Shimada, Iwatshuki (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 09/401,758

(22) Filed: Sep. 23, 1999

(30) Foreign Application Priority Data

Sep. 29, 1998 (JP) .............................. 10-292953

(51) Int. Cl.[7] .............................................. H01R 11/22
(52) U.S. Cl. .......................................... 439/266; 439/73
(58) Field of Search ........................... 439/73, 269, 70, 439/71, 72, 264–268

(56) References Cited

U.S. PATENT DOCUMENTS 5,713,751 A * 2/1998 Fukunaga ................... 439/266

* cited by examiner

Primary Examiner—Brian Sircus
Assistant Examiner—Son V. Nguyen
(74) Attorney, Agent, or Firm—Bachman & LaPointe, P.C.

(57) ABSTRACT

A first contact portion of each of contact pins is formed with a positioning stepped portion, and a socket body is formed with a positioning engaging portion. While the positioning stepped portion is engaged with the positioning engaging portion in a state where a first spring portion of each contact pin is elastically deformed, the positioning stepped portion is pressed against the positioning engaging portion by means of an elastic force of the first spring portion so that positioning of each first contact portion supporting corresponding one of IC terminals is accomplished relative to the socket body with high accuracy. Thus, dispersion of positions of the first contact portions is diminished among the contact pins.

9 Claims, 8 Drawing Sheets

IC SOCKET AND CONTACT PIN THEREOF

BACKGROUND OF THE INVENTION

1. Field of the Invention

The present invention relates to an IC socket having a plurality of contact pins for connecting terminals of an integrated circuit (IC) and an external circuit board for the purpose of conducting an electric test for the IC.

2. Description of the Related Art

Figure 13:
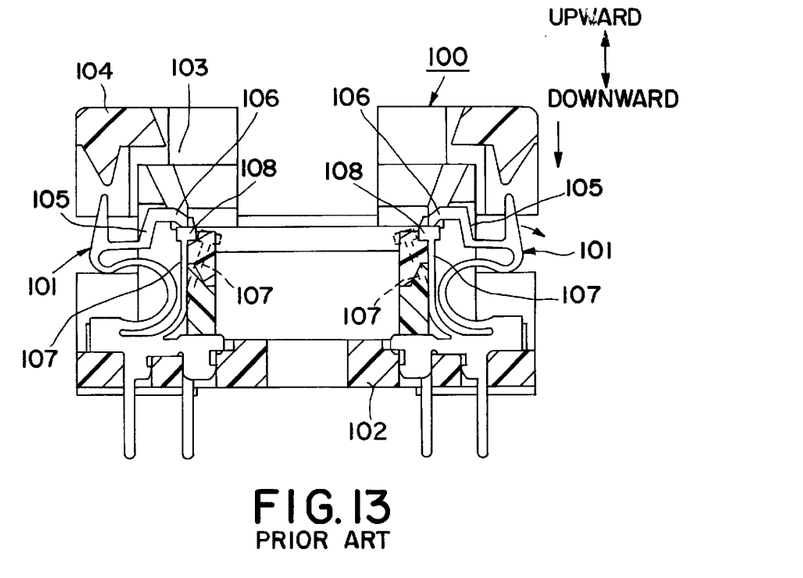
FIG. 13 is a front sectional view of a conventional IC socket.

As shown in FIG. 13, an IC socket 100 of an open top type has a plurality of contact pins 101 attached to a socket body 102 for connecting terminals 111 of an IC (e.g. QFP, SOP, TSOP) 110 (see FIG. 14) and an external electric testing circuit (not shown). Each contact pin 101 comprises a movable pin 105 and a stationary pin 107. A cover 104 having an IC loading window 103 is supported by the socket body 102 so as to be vertically movable in FIG. 13.

When the cover 104 is pushed downward in FIG. 13, the movable pins 105 are pushed by the cover 104 to be bent so that movable contact portions 106 of the movable pins 105 retreat from stationary contact portions 108 of the corresponding stationary pins 107 to receive the corresponding IC terminals 111 on the stationary contact portions 108. Then, when the cover 104 returns to the initial position, each of the IC terminals 111 is pressed against the stationary contact portion 108 due to an elastic force of the movable pin 105 so as to be firmly held between the movable contact portion 106 and the stationary contact portion 108 (see FIG. 14). In this state, the IC terminals 111 are energized to conduct an electric test for the IC 110.

Figure 14:
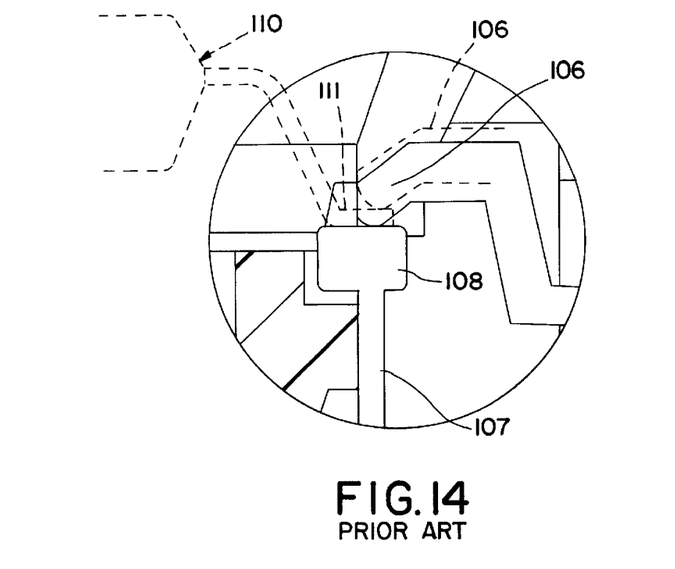
FIG. 14 is an enlarged view of a part of the IC socket shown in FIG. 13.

As best seen in FIG. 14, each stationary contact portion 108 is increased in size as compared with the other portions of the stationary pin 107 for stably receiving the IC terminal 111 thereon, while the socket body 102 is recessed for ensuring a sufficient space for each of the enlarged stationary contact portions 108.

After the electric test for the IC 110 has been finished, the cover 104 is again pushed downward in FIG. 13 to retreat the movable contact portions 106 from the stationary contact portions 108 so that the IC 110 is removed from the IC socket 100.

In the foregoing conventional IC socket 100, each of the contact pins 101 is mounted to the socket body 102 such that the corresponding stationary pin 107 is forcibly displaced from a dotted line position to a solid line position as shown in FIG. 13, so as to support the corresponding IC terminal 111 on the stationary contact portion 108. However, as seen from FIGS. 13 and 14, no means are provided for positioning the stationary contact portions 108 in vertical directions in the figures. Thus, it is possible that manufacturing errors of the contact pins 101 and/or assembling errors thereof relative to the socket body 102 cause supporting positions of the IC terminals 111 to be largely dispersed among the contact pins 101.

In such a case, if the IC terminals 111 are made of a relatively soft material such as copper, they may be deformed when sandwiched between the stationary contact portions 108 and the movable contact portions 106.

SUMMARY OF THE INVENTION

Therefore, it is an object of the present invention to provide an IC socket which is capable of improving accuracy of supporting positions of IC terminals and thus avoiding deformation of the IC terminals.

It is another object of the present invention to provide contact pins for use in such an IC socket.

According to one aspect of the present invention, there is provided an IC socket comprising a socket body elastically supporting a cover having an IC loading window, the cover being movable toward and away from the socket body; and a plurality of contact pins attached to the socket body for connecting IC terminals and an external electric testing circuit, each of the contact pins comprising: a base portion fixed to the socket body; a first contact portion connected to the base portion via a first spring portion for supporting corresponding one of the IC terminals; and a second contact portion connected to the base portion via a second spring portion, the second contact portion forced by the cover, when the cover is moved toward the socket body, so as to elastically deform the second spring portion so that the second contact portion retreats from the first contact portion to allow the one of the IC terminals to be received on the first contact portion, and the second contact portion pressing the one of the IC terminals against the first contact portion by means of an elastic force of the second spring portion when the cover returns to an initial position, wherein each of the first contact portions is formed with a positioning stepped portion, and the socket body is formed with a positioning engaging portion which engages with the positioning stepped portion in a state where the first spring portion is elastically deformed, so that the positioning stepped portion is pressed against the positioning engaging portion by means of an elastic force of the first spring portion.

It may be arranged that the positioning stepped portion is pressed against an upper surface of the positioning engaging portion by means of a tensile force of the first spring portion.

It may be arranged that the positioning stepped portion is pressed against a lower surface of the positioning engaging portion by means of a compressive force of the first spring portion.

It may be arranged that the positioning stepped portion is in the form of one of a projection and a recess, and the positioning engaging portion is in the form of one of a recess and a projection, which are engaged with each other.

It may be arranged that contact surfaces of the positioning stepped portion and the positioning engaging portion are inclined surfaces.

It may be arranged that the positioning engaging portion is detachably mounted to the socket body.

According to another aspect of the present invention, for use in an IC socket having a plurality of contact pins attached to a socket body for connecting IC terminals and an external electric testing circuit, the socket body elastically supporting a cover having an IC loading window and movable toward and away from the socket body, each of the contact pins comprising a base portion fixed to the socket body; a first contact portion connected to the base portion via a first spring portion for supporting corresponding one of the IC terminals; and a second contact portion connected to the base portion via a second spring portion, the second contact portion forced by the cover, when the cover is moved toward the socket body, so as to elastically deform the second spring portion so that the second contact portion retreats from the first contact portion to allow the one of the IC terminals to be received on the first contact portion, and the second contact portion pressing the one of the IC terminals against the first contact portion by means of an elastic force of the second spring portion when the cover returns to an initial position, wherein each of the first contact portions is formed with a positioning stepped portion which engages with a positioning engaging portion formed at the socket body in a state where the first spring portion is elastically deformed, so that the positioning stepped portion is pressed against the positioning engaging portion by means of an elastic force of the first spring portion.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, preferred embodiments of the present invention will be described hereinbelow with reference to the accompanying drawings.

[First Embodiment]

Figure 1:
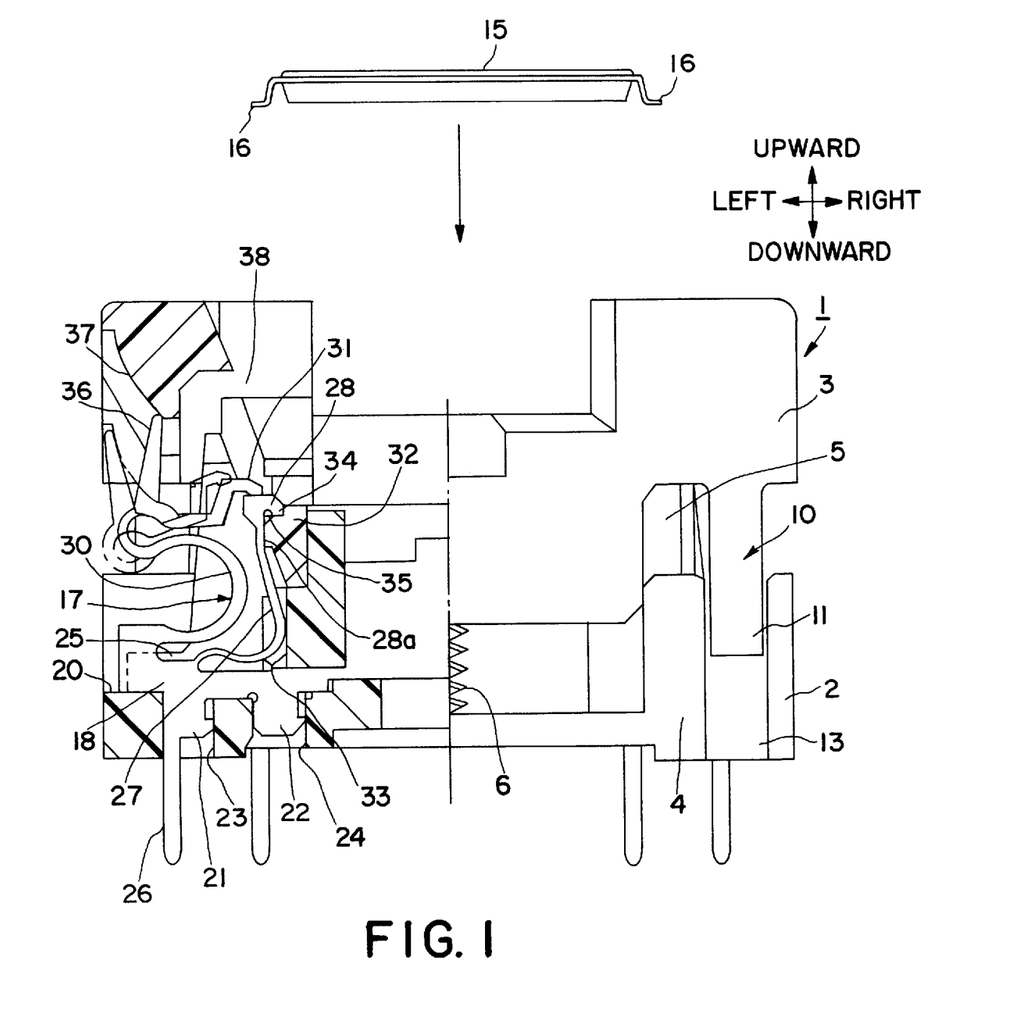
FIG. 1 is a front view of an IC socket with a left half thereof being sectioned, according to a first preferred embodiment of the present invention.
Figure 2:
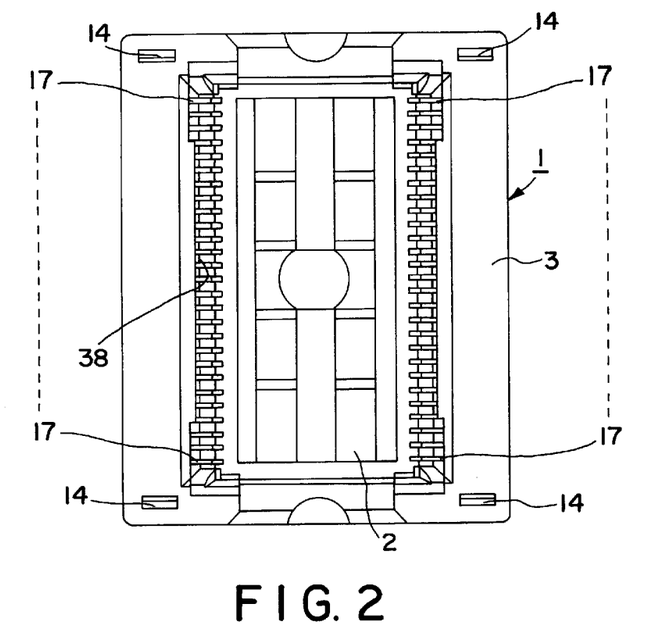
FIG. 2 is a plan view of the IC socket shown in FIG. 1.

FIG. 1 is a sectional view of an IC socket 1 according to the first preferred embodiment of the present invention, and FIG. 2 is a plan view of the IC socket 1.

As shown in these figures, a cover 3 is mounted to a socket body 2 so as to be vertically movable in FIG. 1. Specifically, the socket body 2 is provided with a pair of cover guides 4, while the cover 3 is formed with corresponding guide grooves 5 for slidable engagement with the cover guides 4, so that the cover 3 is vertically movable in FIG. 1. guided by the cover guides 4, relative to the socket body 2. The socket body 2 and the cover 3 are made of an insulating resin material.

Figure 4:
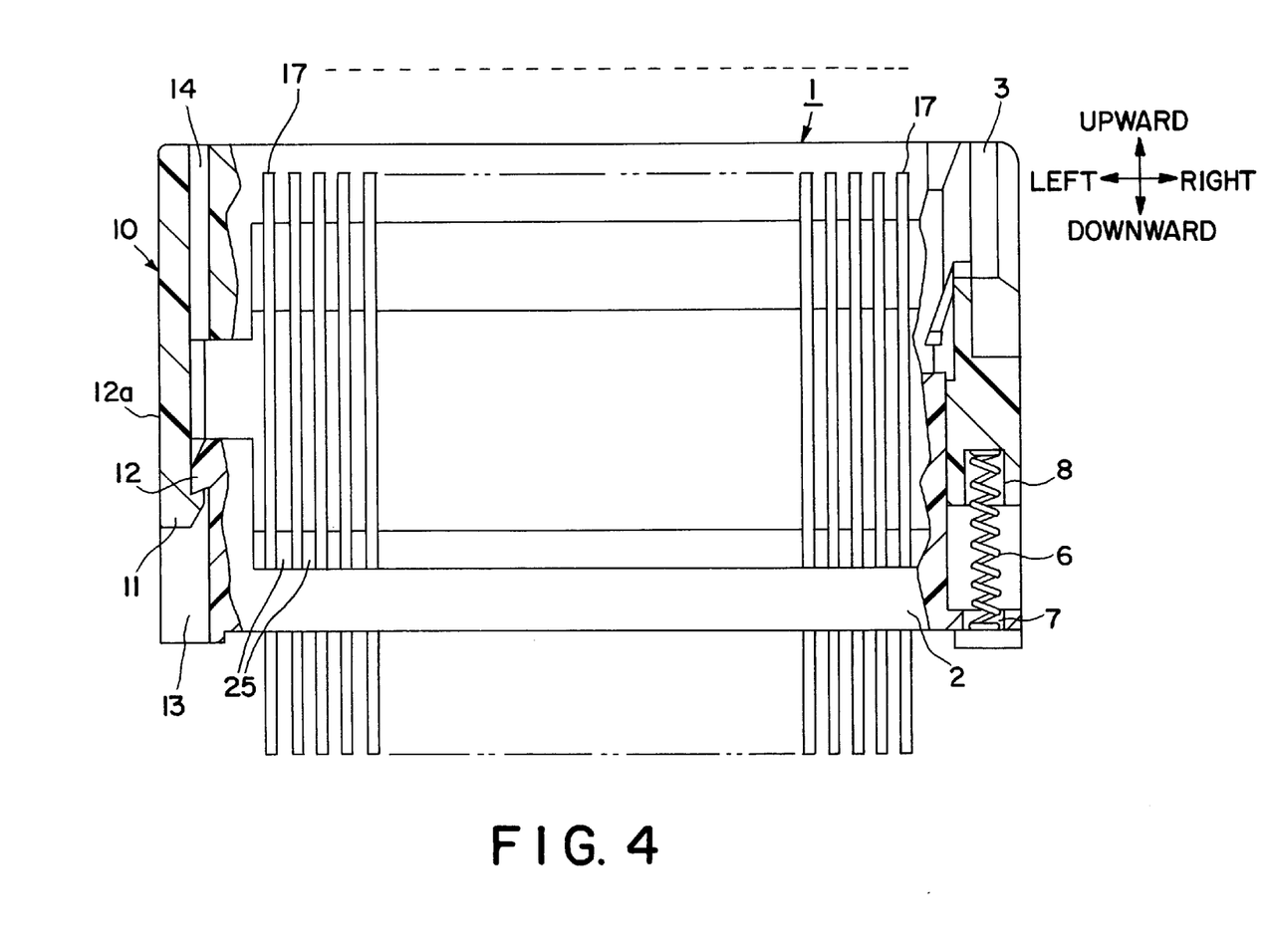
FIG. 4 is a partly-sectioned side view of the IC socket shown in FIG. 1.

Between the socket body 2 and the cover 3 are disposed coil springs 6. Specifically, as shown in FIG. 4, a pair of spring disposing holes 7 and 8 are formed on confronting surfaces of the socket body 2 and the cover 3 for each of the coil springs 6. Both ends of each coil spring 6 are received in the spring disposing holes 7 and 8.

The cover 3 is mounted to the socket body 2 while compressing the coil springs 6 to a given degree, so that the cover 3 is constantly urged upward in FIG. 1 by the coil springs 6 relative to the socket body 2. The uppermost position of the cover 3 is determined by a stopper mechanism 10. The coil springs 6 are provided at least at a front and a rear end of the IC socket 1 in this embodiment.

The stopper mechanism 10 comprises pawls 11 formed at four corners of the cover 3 and corresponding pawls 12 of the socket body 2 for engaging with the pawls 11. The pawls 11 of the cover 3 are slidably engaged with corresponding grooves 13 formed on the socket body 2 and, when the cover 3 is pushed downward in FIG. 4, the pawls 11 are elastically pushed open along slopes 12a of the corresponding pawls 12 so as to get over the pawls 12 and then engage with the pawls 12. In this fashion, the cover 3 is attached to the socket body 2. On the other hand, the cover 3 is detached from the socket body 2 by inserting plate-like members (not shown) through holes 14 having a rectangular cross-section formed in the cover 3, elastically pushing open the pawls 11 and then moving the cover 3 in a direction away from the socket body 2 (upward in FIG. 4).

Figure 11:
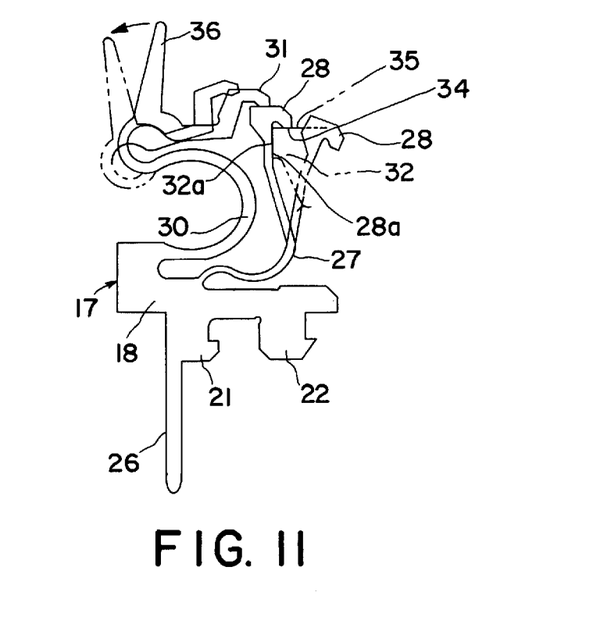
FIGS. 11 and 12 are diagrams for explaining an operation of a contact pin according to the first preferred embodiment of the present invention.

The socket body 2 is mounted with a plurality of contact pins 17 for connecting terminals 16 of an IC 15 and an external electric testing circuit (not shown). Each of the contact pins 17 has a base portion 18 received in a pin mounting groove 20 of the socket body 2, and projections 21 and 22 of the base portion 18 are press-fitted into slits 23 and 24, respectively, so that each contact pin 17 is fixed to the socket body 2. Ribs 25 are formed in the socket body 2 between the adjacent contact pins 17 for preventing the contact pins 17 from contacting with each other. As shown in FIGS. 1 and 11, each contact pin 17 has a connection arm 26 projecting downward in the figures from the base portion 18. The connection arm 26 extends downward in FIG. 1 through the socket body 2 so as to be connected to the non-shown external electric testing circuit.

Each of the contact pins 17 is made of a highly-conductive and elastic material, such as beryllium copper. As shown in FIGS. 1 and 11, each contact pin 17 has a first contact portion 28 connected to the base portion 18 via a first spring portion 27 and further has a second contact portion 31 connected to the base portion 18 via a second spring portion 30.

Figure 3:
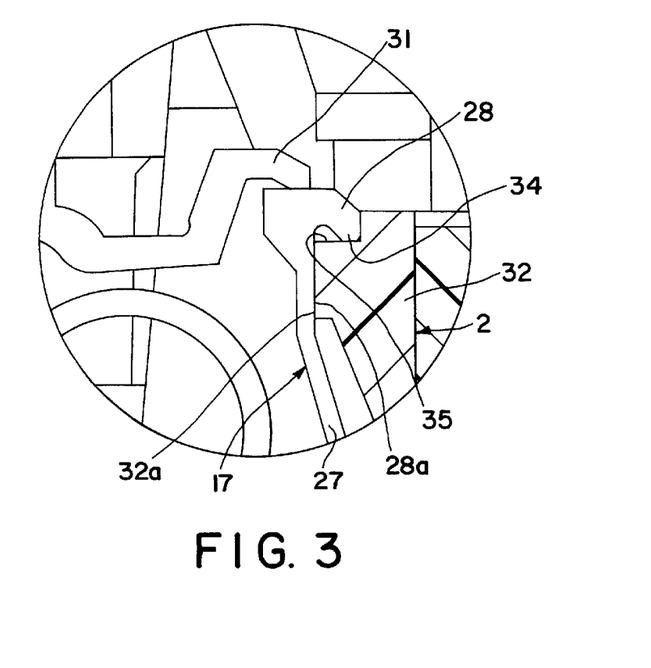
FIG. 3 is an enlarged view of a part of the IC socket shown in FIG. 1.

The first spring portion 27 is received in corresponding one of engaging grooves 33 of a pin support block 32 of the socket body 2 such that the first spring portion 27 is elastically deformed from a two-dot chain line position to a solid line position shown in FIG. 11. Further, the first contact portion 28 is formed with a positioning stepped portion 34. As shown in FIG. 3, the pin support block 32 of the socket body 2 is formed with a positioning engaging portion 35. against which each of the positioning stepped portions 34 is pressed by means of an elastic force of the first spring portion 27. Thus, the first contact portion 28 is positioned vertically in the figure. i.e. vertical positioning in the figure of the first contact portion 28 is accomplished. In this event, a tensile stress is generated in the first spring portion 27 so that the positioning stepped portion 34 is pressed against the positioning engaging portion 35 by this tensile force. Further, a side surface 28a at a lower end of the first contact portion 28 is pressed against a side end surface 32a of the pin support block 32 due to the elastic force of the first spring portion 27 so that right and left positioning in the figure of the first contact portion 28 is accomplished.

As shown in FIGS. 1 and 11, an arm 36 projects upward in the figures at an upper end of each of the second spring portions 30. When the cover 3 is pushed downward in FIG. 1 against elastic forces of the coil springs 6, the arm 36 is pushed by an arc-shaped pressing surface 37 of the cover 3 so as to be displaced to a two-dot chain line position in FIGS. 1 and 11.

Figure 12:
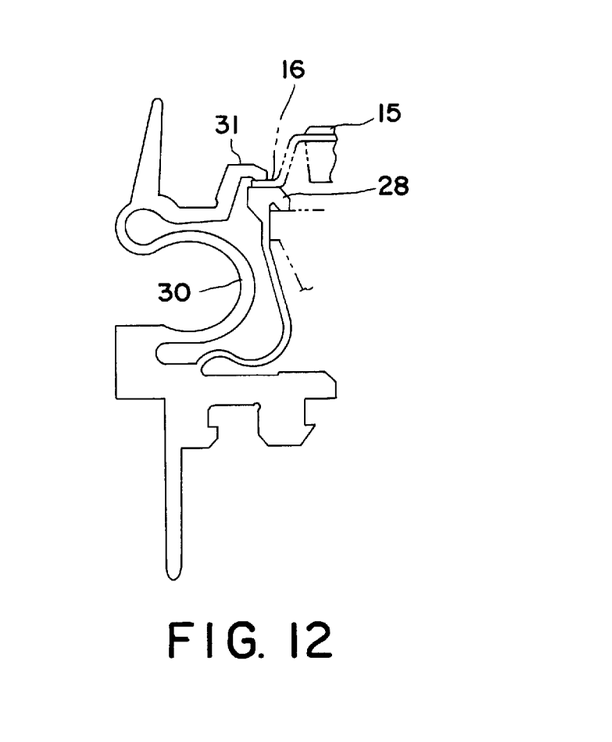

In this event, each of the second spring portions 30 is subjected to bending in a counterclockwise direction in FIG. 11. As a result, the second contact portion 31 retreats from an upper surface of the first contact portion 28. In this state, the IC 15 is inserted into the cover 3 via an IC loading window 38 of the cover 3 so that the terminals 16 of the IC 15 are placed on the upper surfaces of the first contact portions 28. Then, by releasing a depression force applied to the cover 3, the cover 3 returns to the initial position by the elastic forces of the coil springs 6. As a result, each of the second spring portions 30 moves in a clockwise direction from the two-dot chain line in FIG. 11 so that, as shown in FIG. 12, the second contact portion 31 presses corresponding one of the terminals 16 of the IC 15 against the upper surface of the first contact portion 28 by means of an elastic force of the second spring portion 30. Thus, each of the terminals 16 of the IC 15 is securely held between the first contact portion 28 and the second contact portion 31 under a given contact pressure. Then, in this state, the non-shown external electric testing circuit and the IC 15 are electrically connected to each other via the contact pins 17 to conduct an electric test for the IC 15.

After the electric test for the IC 15 has been finished, the cover 3 is depressed against the elastic forces of the coil springs 6 to push each of the arms 36 by the arc-shaped pressing surface 37 of the cover 3 so that the second spring portion 30 is elastically bent to retreat the second contact portion 31 from an upper surface of the corresponding terminal 16 to the two-dot chain line position in FIGS. 1 and 11. Then, the IC 15 is removed to the exterior of the cover 3 via the IC loading window 38.

As described above, in this embodiment, the pin support block 32 of the socket body 2 is formed with the positioning engaging portion 35 while the first contact portion 28 of each of the contact pins 17 is formed with the positioning stepped portion 34, so that the positioning stepped portion 34 is pressed against the upper surface of the positioning engaging portion 35 by the elastic force of the first spring portion 27 so as to achieve positioning of the first contact portion 28 in a height direction (vertical direction in FIG. 1). Thus, the height-direction positioning of the first contact portion 28 of each of the contact pins 17 can be accomplished with high accuracy. Therefore, since the dispersion of the height-direction positions of the first contact portions 28 supporting the terminals 16 of the IC 15 can be diminished, even if the terminals 16 of the IC 15 are made of a relatively soft material such as copper, each of the IC terminals 16 is prevented from deformation when held between the first contact portion 28 and the second contact portion 31.

Further, in this embodiment, since the dispersion of the height direction positions of the first contact portions 28 supporting the IC terminals 16 is small as described above, the contact pressures between the IC terminals 16 and the contact pins 17 can be set stable and uniform. Thus, the reliable contact between each of the IC terminals 16 and the contact pin 17 can be ensured to enable an electric test with higher accuracy as compared with the prior art.

Further, in this embodiment, since the positioning stepped portion 34 of the first contact portion 28 of each contact pin 17 is supported by the positioning engaging portion 35 of the pin support block 32 of the socket body 2 as described above, even if the first contact portion 28 is pressed by the second contact portion 31, the first contact portion 28 is prevented from displacing downward in FIG. 1. Thus, no change in the supporting position of each of the IC terminals 16 occurs.

[Second Embodiment]

Figure 5:
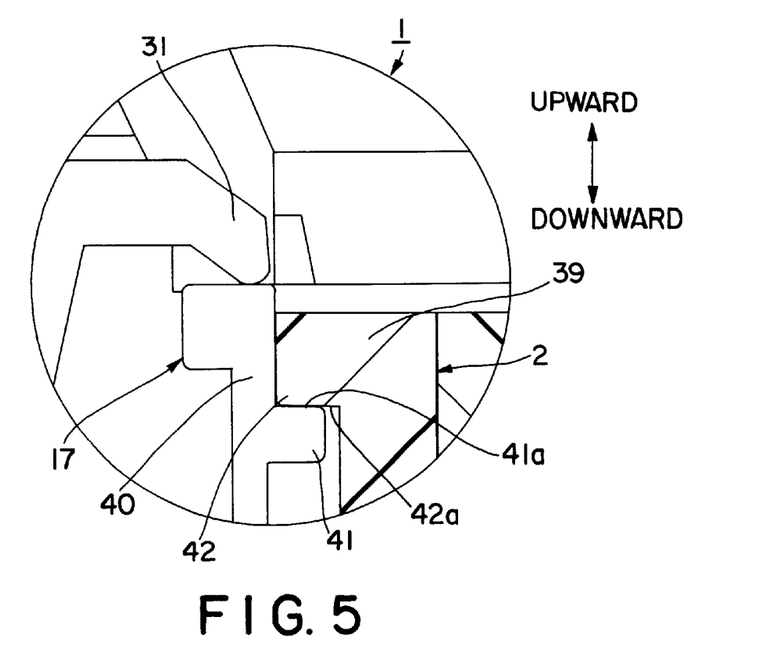
FIG. 5 is an enlarged view of a part of an IC socket according to a second preferred embodiment of the present invention.

FIG. 5 is an enlarged view of a part of an IC socket 1 according to the second preferred embodiment of the present invention. In this embodiment, a first contact portion 40 of each of contact pins 17 has a positioning stepped portion 41 projecting toward a pin support block 39 of a socket body 2, and an upper surface 41a of the positioning stepped portion 41 is pressed against a lower surface 42a of a positioning engaging portion 42 of the pin support block 39. Specifically, the first spring portion 27 (see FIG. 1) is bent upon engaging the positioning stepped portion 41 with the positioning engaging portion 42 so that a compressive stress is generated in the first spring portion 27, and the first spring portion 27 presses the positioning stepped portion 41 against the lower surface 42a of the positioning engaging portion 42 by means of this compressive force.

As a result, positioning of the first contact portion 40 of each contact pin 17 can be accomplished in a height direction of the IC socket 1 (vertical direction in FIG. 5) so that the dispersion of the supporting positions of the IC terminals 16 (see FIG. 1) can be diminished as in the foregoing first preferred embodiment. Thus, as in the foregoing first preferred embodiment, even if the IC terminals 16 are made of a relatively soft material such as copper, each of the IC terminals 16 is prevented from deformation when held between the first contact portion 40 and the second contact portion 31, and further, the contact pressures between the IC terminals 16 and the contact pins 17 can be set stable and uniform to enable an electric test with high accuracy.

Further, in this embodiment, the upper surface 41a of the positioning stepped portion 41 of the first contact portion 40 is pressed against the lower surface 42a of the positioning engaging portion 42 of the pin support block 39 so that the compressive stress is generated in the first spring portion 27 (see FIG. 1). Thus, even if a force is applied in a direction to pull out the contact pin 17 from the socket body 2, i.e. in a direction to push upward the connection arm 26 in FIG. 1, the first spring portion 27 and the first contact portion 40 stand against such a force to prevent the contact pin 17 from coming off the socket body 2.

It is to be noted that the first contact portion 40 of the contact pin 17 represents a portion that is located above the first spring portion 27 in FIG. 1 which is subjected to bending, and that supports the IC terminal 16 without effecting a spring function.

In this embodiment, the compressive force of the first spring portion 27 is set greater than a pressing force applied to the first contact portion 40 by the second contact portion 31. Thus, when the IC terminal 16 is held between the first contact portion 40 and the second contact portion 31, the first contact portion is prevented from displacing downward In FIG. 5 and thus can support the IC terminal 16 at a predetermined position.

[Third Embodiment]

Figure 6:
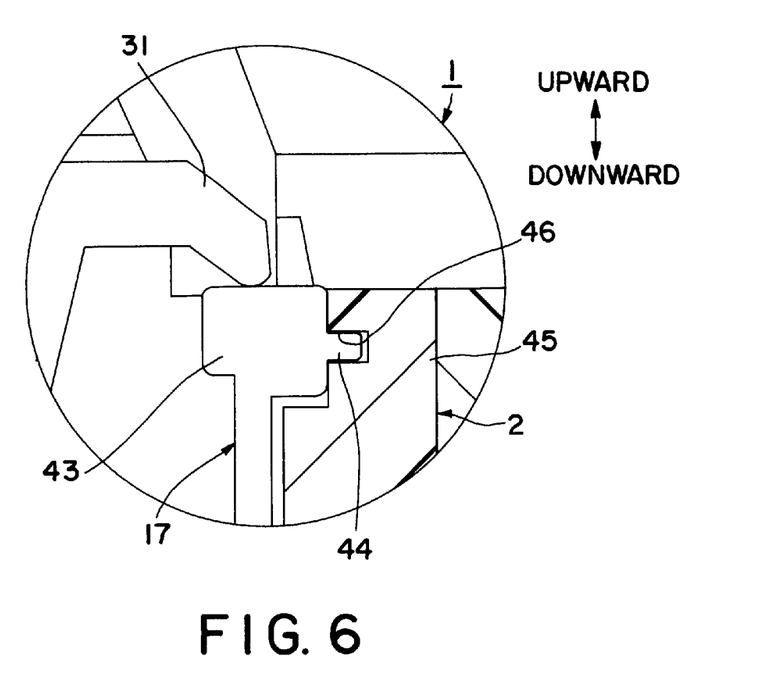
FIG. 6 is an enlarged view of a part of an IC socket according to a third preferred embodiment of the present invention.

FIG. 6 is an enlarged view of a part of an IC socket according to the third preferred embodiment of the present invention. In this embodiment, a first contact portion 43 of each of contact pins 17 is formed with an essentially rectangular projection 44 serving as a positioning stepped portion, and the projection 44 engages with an essentially rectangular recess 46 serving as a positioning engaging portion formed on a pin support block 45. An upper or lower surface of the projection 44 is pressed against an upper or lower surface of the recess 46 by an elastic force of the first spring portion 27 (see FIG. 1).

As a result, positioning of the first contact portion 43 of each contact pin 17 can be accomplished in a height direction of the IC socket 1 (vertical direction in FIG. 6) so that the dispersion of the supporting positions of the IC terminals 16 (see FIG. 1) can be diminished as in the foregoing first preferred embodiment. Thus, as in the foregoing first preferred embodiment, even if the IC terminals 16 are made of a relatively soft material such as copper, each of the IC terminals 16 is prevented from deformation when held between the first contact portion 43 and the second contact portion 31, and further, the contact pressures between the IC terminals 16 and the contact pins 17 can be set stable and uniform to enable an electric test with high accuracy.

Further, in this embodiment, since the projection 44 of the first contact portion 43 is engaged with the recess 46 of the pin support block 45, even if a force is applied in a direction to pull out the contact pin 17 from the socket body 2, i.e. in a direction to push upward the connection arm 26 in FIG. 1, the first spring portion 27 and the first contact portion 43 stand against such a force to prevent the contact pin 17 from coming off the socket body 2.

[Fourth Embodiment]

Figure 7:
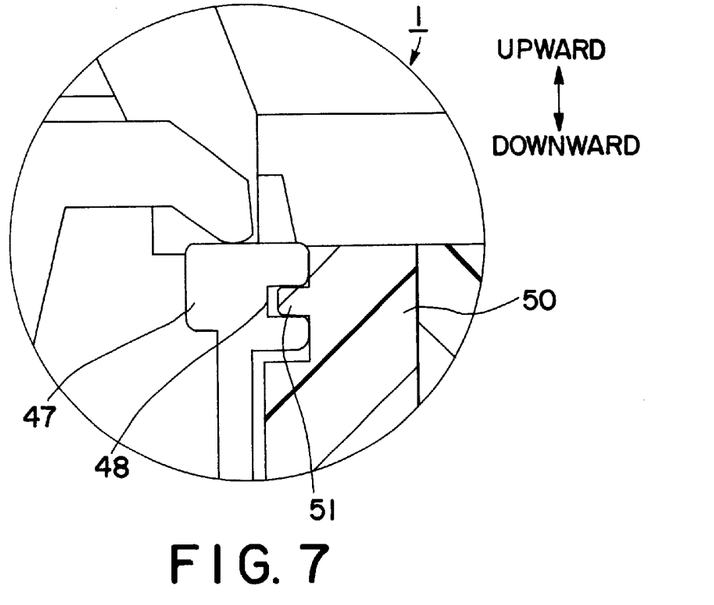
FIG. 7 is an enlarged view of a part of an IC socket according to a fourth preferred embodiment of the present invention.

FIG. 7 is an enlarged view of a part of an IC socket 1 according to the fourth preferred embodiment of the present invention. As appreciated from FIG. 7, this embodiment has a structure reverse to that of the foregoing third preferred embodiment. Specifically, in this embodiment, a first contact portion 47 is formed with an essentially rectangular recess 48 serving as a positioning stepped portion, while a pin support block 50 is formed with an essentially rectangular projection 51 serving as a positioning engaging portion. By engaging the recess 48 of the first contact portion 47 with the projection 51 of the pin support block 50, positioning of the first contact portion 47 is accomplished in a height direction of the IC socket 1 (vertical direction in FIG. 7). As a result, in this embodiment, effects similar to those in the foregoing third preferred embodiment can be achieved.

[Fifth Embodiment]

Figure 8:
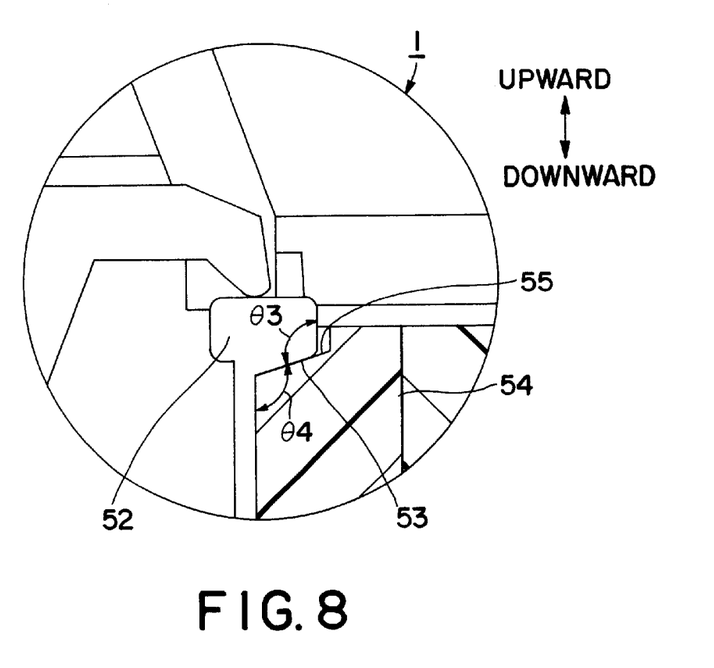
FIG. 8 is an enlarged view of a part of an IC socket according to a fifth preferred embodiment of the present invention.

FIG. 8 is an enlarged view of a part of an IC socket 1 according to the fifth preferred embodiment of the present invention. In this embodiment, a first contact portion 52 is formed with an inclined surface 53 serving as a positioning stepped portion, while a pin support block 54 is formed with a corresponding inclined surface 55 serving as a positioning engaging portion. By engaging the inclined surface 53 of the first contact portion 52 with the inclined surface 55 of the pin support block 54, positioning of the first contact portion 52 is accomplished in a height direction of the IC socket 1 (vertical direction in FIG. 8). As a result, in this embodiment, effects similar to those in the foregoing first preferred embodiment can be achieved, and further, the first contact portion 52 and the pin support block 54 can be easily engaged with each other. As appreciated from FIG. 8, in this embodiment, an angle $\theta3$ of the first contact portion 52 and an angle $\theta4$ of the pin support block 54 are both set to be an obtuse angle. This facilitates smooth engagement between the first contact portion 52 and the pin support block 54.

In the foregoing third and fourth preferred embodiments, if engaging surfaces of the positioning stepped portion 44, 48 of the first contact portion 43, 47 and the positioning engaging portion 46, 51 of the pin support block 45, 50 are formed as inclined surfaces like in this embodiment, the positioning stepped portion 44, 48 and the positioning engaging portion 46, 51 can be easily engaged with each other.

[Sixth Embodiment]

Figure 9:
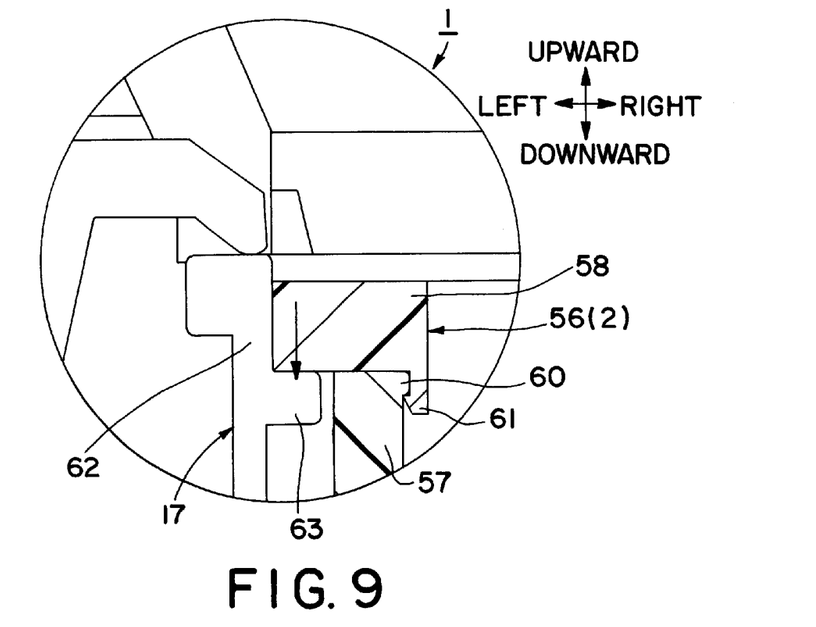
FIG. 9 is an enlarged view of a part of an IC socket according to a sixth preferred embodiment of the present invention.

FIG. 9 is an enlarged view of a part of an IC socket 1 according to the sixth preferred embodiment of the present invention. In this embodiment, a pin support block 56 comprises a block base portion 57 and a block head portion 58 which is detachable from the block base portion 57. Specifically, the block base portion 57 is formed with a plurality of pawls 60, while the block head portion 58 is formed with corresponding hooks 61 for engagement with the pawls 60. By engaging the hooks 61 with the pawls 60, the block base portion 57 and the block head portion 58 are united with each other. On the other hand, by elastically deforming the hooks 61 to disengage the hooks 61 from the pawls 60, the block head portion 58 can be detached from the block base portion 57.

In this embodiment, the block head portion 58 projects at a lateral side of the block base portion 57 (left in FIG. 9) to abut with an upper surface of a positioning stepped portion 63 formed at a first contact portion 62 of each of contact pins 17, so that the block head portion 58 works as a positioning engaging portion for positioning the first contact portion 62 in a height direction of the IC socket 1. Thus, in this embodiment, the block head portion 58 serving as a positioning engaging portion is detachable relative to the block base portion 57.

According to this embodiment, since the block base portion 57 and the block head portion 58 constituting the pin support block 56 are simplified in shape, the pin support block 56 and thus the socket body 2 can be easily produced. This embodiment differs from the foregoing second preferred embodiment only in the structure of the pin support block 56. Thus, in this embodiment, effects similar to those in the foregoing second preferred embodiment can be achieved.

[Seventh Embodiment]

Figure 10:
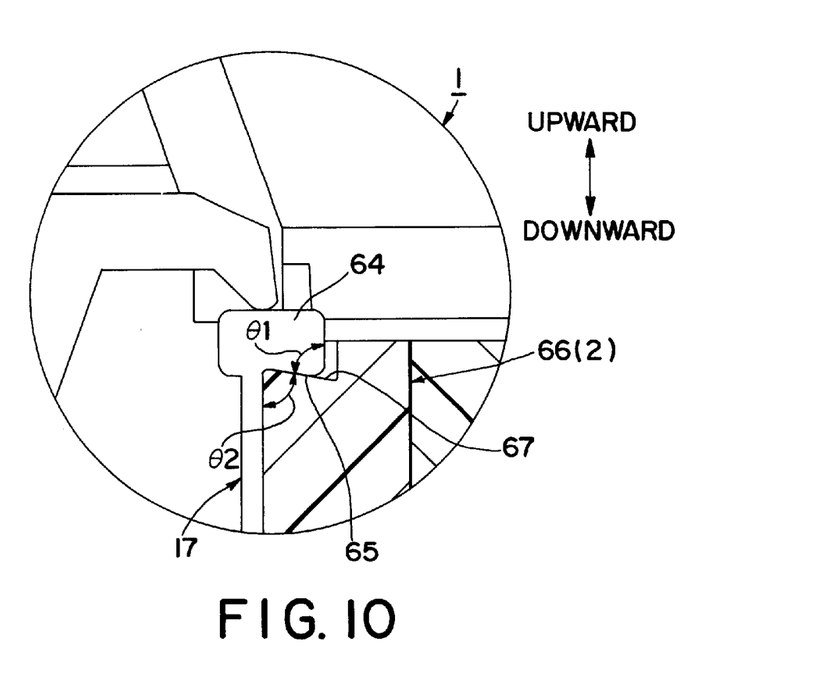
FIG. 10 is an enlarged view of a part of an IC socket according to a seventh preferred embodiment of the present invention.

FIG. 10 is an enlarged view of a part of an IC socket 1 according to the seventh preferred embodiment of the present invention. In this embodiment, engaging surfaces of a positioning stepped portion 65 of a first contact portion 64 and a positioning engaging portion 67 of a pin support block 66 of a socket body 2 are inclined surfaces. In this embodiment, as opposed to the foregoing fifth preferred embodiment, an angle $\theta1$ of the first contact portion 64 and an angle $\theta2$ of the pin support block 66 are both set to be an acute angle.

By engaging the positioning stepped portion 65 with the positioning engaging portion 67, the positioning stepped portion 65 is pressed against the positioning engaging portion 67 by means of an elastic force of the first spring portion 27 (see FIG. 1) so that positioning of the first contact portion 64 is accomplished in a height direction of the IC socket I (vertical direction in FIG. 10). Since, as described above, the angle $\theta1$ of the first contact portion 64 and the angle $\theta2$ of the pin support block 66 are both set to be the acute angle, the positioning stepped portion 65 and the positioning engaging portion 67 can be engaged more reliably.

Since this embodiment is essentially the same as the foregoing first preferred embodiment except for the feature described above, effects similar to those in the foregoing first preferred embodiment can also be achieved.

In the foregoing first to fifth and seventh preferred embodiments, if the positioning engaging portion is detachably mounted to the pin support block as in the foregoing sixth preferred embodiment, the socket body can be easily produced likewise.

As described above, according to the foregoing preferred embodiments of the present invention, the first contact portion of each of the contact pins is formed with the positioning stepped portion, and the socket body is formed with the positioning engaging portion. When the positioning stepped portion is engaged with the positioning engaging portion in a state where the first spring portion of each contact pin is elastically deformed, the positioning stepped portion is pressed against the positioning engaging portion by means of the elastic force of the first spring portion so that positioning of the first contact portion supporting corresponding one of the IC terminals is accomplished relative to the socket body with high accuracy. Thus, the dispersion of the positions of the first contact portions is diminished among the contact pins. As a result, even if the IC terminals are made of a relatively soft material such as copper, the IC terminals are prevented from deformation when held between the first contact portions and the second contact portions.

Further, since the dispersion of the positions of the first contact portions is diminished among the contact pins, the IC terminals are held between the first contact portions and the second contact portions under stable and uniform contact pressures. Thus, there can be achieved an electric test with higher accuracy as compared with the prior art.

While the present invention has been described in terms of the preferred embodiments, the invention is not to be limited thereto, but can be embodied in various ways without departing from the principle of the invention as defined in the appended claims.

What is claimed is:

1. An IC socket comprising:
    a socket body elastically supporting a cover having an IC loading window, said cover being vertically movable toward and away from said socket body; and
    a plurality of contact pins attached to said socket body for connecting IC terminals and an external electric testing circuit,
    each of said contact pins comprising:
        a base portion fixed to said socket body;
        a first contact portion connected to said base portion via a first spring portion for supporting corresponding one of said IC terminals, said first spring portion having a curved shape for generating a tensile or compressive stress in said first spring portion when it is elastically deformed; and
        a second contact portion connected to said base portion via a second spring portion, said second contact portion forced by said cover, when said cover is moved toward said socket body, so as to elastically deform said second spring portion so that said second contact portion retreats from said first contact portion to allow said one of said IC terminals to be received on said first contact portion, and said second contact portion pressing said one of said IC terminals against said first contact portion by means of an elastic force of said second spring portion when said cover returns to an initial position,
        wherein each of said first contact portions is formed with a stepped portion, and said socket body is formed with an engaging portion which engages with said stepped portion in a state where said first spring portion is elastically deformed, so that said stepped portion is vertically pressed against said engaging portion by an elastic force of said first spring portion caused by said tensile or compressive stress generated in said first spring portion, thereby to carry out vertical positioning of said first contact portion.

2. The IC socket according to claim 1, wherein said positioning stepped portion is vertically pressed against an upper surface of said positioning engaging portion by the elastic force of said first spring portion caused by said tensile stress, so that the vertical positioning of said first contact portion is carried out.

3. The IC socket according to claim 1, wherein said positioning stepped portion is vertically pressed against a lower surface of said positioning engaging portion by the elastic force of said first spring portion caused by said compressive stress, so that the vertical positioning of said first contact portion is carried out.

4. The IC socket according to claim 1, wherein said stepped portion is in the form of one of a projection and a recess, and said engaging portion is in the form of one of a recess and a projection, which are engaged with each other.

5. The IC socket according to claim 1, wherein contact surfaces of said positioning stepped portion and said positioning engaging portion are inclined surfaces.

6. The IC socket according to claim 1, wherein said positioning engaging portion is detachably mounted to said socket body.

7. For use in an IC socket having a plurality of contact pins attached to a socket body for connecting IC terminals and an external electric testing circuit, said socket body elastically supporting a cover having an IC loading window and being vertically movable toward and away from said socket body, each of said contact pins comprising:
    a base portion fixed to said socket body;
    a first contact portion connected to said base portion via a first spring portion for supporting corresponding one of said IC terminals, said first spring portion having a curved shape for generating a tensile or compressive stress in said first spring portion when it is elastically deformed; and
    a second contact portion connected to said base portion via a second spring portion, said second contact portion forced by said cover, when said cover is moved toward said socket body, so as to elastically deform said second spring portion so that said second contact portion retreats from said first contact portion to allow said one of said IC terminals to be received on said first contact portion, and said second contact portion pressing said one of said IC terminals against said first contact portion by means of an elastic force of said second spring portion when said cover returns to an initial position,
    wherein each of said first contact portions is formed with a stepped portion which engages with an engaging portion formed at said socket body in a state where said first spring portion is elastically deformed, so that said stepped portion is vertically pressed against said engaging portion by an elastic force of said first spring portion caused by said tensile or compressive stress generated in said first spring portion, thereby to carry out vertical positioning of said first contact portion.

8. The contact pin according to claim 7, wherein said stepped portion is vertically pressed against an upper surface of said engaging portion by the elastic force of said first spring portion caused by said tensile stress, so that the vertical positioning of said first contact portion is carried out.

9. The contact pin according to claim 7, wherein said stepped portion is vertically pressed against a lower surface of said engaging portion by means of the elastic force of said first spring portion caused by said compressive stress, so that the vertical positioning of said first contact portion is carried out.

* * * * *